US012671409B2

(12) United States Patent (10) Patent No.: US 12,671,409 B2
Sun et al. (45) Date of Patent: Jun. 30, 2026

(54) INTERLOCK DEVICE, ENERGY STORAGE SYSTEM, CONTROL METHOD, AND DEVICE THEREOF

(71) Applicant: ALPHA ESS CO., LTD., Nantong (CN)

(72) Inventors: Liyan Sun, Nantong (CN); Xiuli Si, Nantong (CN); Jintao Ma, Nantong (CN); Xiongjiang Liu, Nantong (CN); Haiyan Zhang, Nantong (CN)

(73) Assignee: ALPHA ESS CO., LTD., Nantong (CN)

( * ) Notice: Subject to any disclaimer, the term of this patent is extended or adjusted under 35 U.S.C. 154(b) by 177 days.

(21) Appl. No.: 18/722,487

(22) PCT Filed: Sep. 23, 2022

(86) PCT No.: PCT/CN2022/120879
§ 371 (c)(1),
(2) Date: Jun. 20, 2024

(87) PCT Pub. No.: WO2024/031795
PCT Pub. Date: Feb. 15, 2024

(65) Prior Publication Data
US 2025/0047129 A1 Feb. 6, 2025

(30) Foreign Application Priority Data

Aug. 10, 2022 (CN) .......................... 202210954786.5

(51) Int. Cl.
*H03K 17/28* (2006.01)
*H02H 7/18* (2006.01)
(Continued)

(52) U.S. Cl.
CPC ............... *H03K 17/28* (2013.01); *H02H 7/18* (2013.01); *H02J 7/50* (2026.01); *H02J 7/60* (2026.01);
(Continued)

(58) Field of Classification Search
CPC ........... H03K 17/28; H03K 19/017536; H03K 19/14; H03K 19/20; H03K 17/6871;
(Continued)

(56) References Cited

U.S. PATENT DOCUMENTS

| 8,330,490 | B2 * | 12/2012 | Lee | ......................... | H03K 19/20 |
| | | | | | 326/26 |
| 2013/0015881 | A1 * | 1/2013 | Lee | ......................... | H03K 19/20 |
| | | | | | 326/52 |

(Continued)

FOREIGN PATENT DOCUMENTS

| CN | 101860185 A | 10/2010 |
| CN | 201937248 U | 8/2011 |

(Continued)

OTHER PUBLICATIONS

International Search Report for PCT/CN2022/120879 (PCT/ISA/210) mailed on Feb. 20, 2023.

(Continued)

*Primary Examiner* — Gary L Laxton
(74) *Attorney, Agent, or Firm* — Birch, Stewart, Kolasch & Birch, LLP

(57) ABSTRACT

An interlock device, an energy storage system, a control method, and a control apparatus are provided. The interlock device includes a first interlock circuit, a first drive processing circuit, a first drive status feedback circuit, a second interlock circuit, a second drive processing circuit, and a second drive status feedback circuit. The first interlock circuit, the first drive processing circuit, and the first drive (Continued)

status feedback circuit are connected, and the second interlock circuit, the second drive processing circuit, and the second drive status feedback circuit are connected. The first interlock circuit receives an output of the second drive status feedback circuit, and the second interlock circuit receives an output of the first drive status feedback circuit, thereby forming an interlock circuit.

10 Claims, 5 Drawing Sheets

(51) Int. Cl.

| | |
|---|---|
| *H02J 7/50* | (2026.01) |
| *H02J 7/60* | (2026.01) |
| *H02J 7/62* | (2026.01) |
| *H02J 9/06* | (2006.01) |
| *H03K 17/687* | (2006.01) |
| *H03K 19/0175* | (2006.01) |
| *H03K 19/14* | (2006.01) |
| *H03K 19/20* | (2006.01) |

(52) U.S. Cl.
CPC .................................... *H02J 7/62* (2026.01); *H02J 9/06* (2013.01); *H03K 17/6871* (2013.01); *H03K 19/017536* (2013.01); *H03K 19/14* (2013.01); *H02J 2207/20* (2020.01); *H03K 19/20* (2013.01)

(58) Field of Classification Search
CPC ........ H02J 7/50; H02J 7/62; H02J 7/60; H02J 9/06; H02J 2207/20; H02H 7/18
See application file for complete search history.

(56) References Cited

U.S. PATENT DOCUMENTS

| | | | |
|---|---|---|---|
| 2015/0155796 A1 | 6/2015 | Hsieh et al. | |
| 2019/0013064 A1 | 1/2019 | Shah et al. | |
| 2021/0143774 A1 | 5/2021 | Cummings et al. | |
| 2022/0009351 A1* | 1/2022 | Fu ........................ | B60L 3/0023 |

FOREIGN PATENT DOCUMENTS

| | | |
|---|---|---|
| CN | 103138554 A | 6/2013 |
| CN | 214154334 U | 9/2021 |
| CN | 214874243 U | 11/2021 |
| CN | 216056382 U | 3/2022 |
| CN | 216904411 U | 7/2022 |
| WO | WO 2024/031795 A1 | 2/2024 |

OTHER PUBLICATIONS

Written Opinion of the International Searching Authority for PCT/CN2022/120879 (PCT/ISA/237) mailed on Feb. 20, 2023.

* cited by examiner

A2

A3

B1

B2

B3

INTERLOCK DEVICE, ENERGY STORAGE SYSTEM, CONTROL METHOD, AND DEVICE THEREOF

CROSS-REFERENCE TO RELATED APPLICATION

The application claims priority from Chinese Patent Application No. 202210954786.5, filed Aug. 10, 2022, entitled "Interlock Device, Energy Storage System, Control Method, and Device Thereof", all of which are incorporated herein by reference in their entirety.

TECHNICAL FIELD

The present application relates to a technical field of energy storage, and more particularly to an interlock device, energy storage system, control method, and device thereof.

BACKGROUND

With the development of power electronics technology, the application of interlock devices for drive signals is also gradually becoming widespread, especially in applications such as Uninterruptible Power Supplies (UPS), photovoltaic inverters, photovoltaic energy storage integrated devices, and frequency converters. An interlock device refers to a circuit that prevents other circuits from operating when one circuit in multiple circuits is operating, even if input signals are applied to these other circuits. In other words, an interlock circuit is used to prevent circuit operation until specific conditions are met.

Thus, designing an interlock device has become an urgent problem to solve.

SUMMARY

In view of this, an objective of the present application is to provide an interlock device, energy storage system, control method, and device thereof.

To achieve one of the above objectives, an embodiment of the present application provides an interlock device, comprising: a first interlock circuit, a first drive processing circuit, a first drive status feedback circuit, a second interlock circuit, a second drive processing circuit, and a second drive status feedback circuit; the first interlock circuit is provided with a first input terminal and a second input terminal, configured to output a low level signal when the first input terminal and the second input terminal input high level signals, and configured to output a high level signal otherwise; the first drive processing circuit is configured to receive a level signal output by the first interlock circuit, configured to output a high level signal when receiving a low level signal, and configured to output a low level signal when receiving a high level signal; the first drive status feedback circuit is configured to receive a level signal output by the first drive processing circuit, configured to output a high level signal through an output terminal of the first drive status feedback circuit when receiving a low level signal, and configured to output a low level signal through the output terminal of the first drive status feedback circuit when receiving a high level signal; the second interlock circuit is provided with a first input terminal and a second input terminal, configured to output a low level signal when the first input terminal and the second input terminal input high level signals, and configured to output a high level signal otherwise; the second drive processing circuit is configured to receive a level signal output by the second interlock circuit, configured to output a high level signal when receiving a low level signal, and configured to output a low level signal when receiving a high level signal; the second drive status feedback circuit is configured to receive a level signal output by the second drive processing circuit, configured to output a high level signal through an output terminal of the second drive status feedback circuit when receiving a low level signal, and configured to output a low level signal through the output terminal of the second drive status feedback circuit when receiving a high level signal; and the second input terminal is configured to receive a level signal output by the second drive status feedback circuit, and the second input terminal is configured to receive a level signal output by the first drive status feedback circuit.

As a further improvement of an embodiment of the present application, the first interlock circuit specifically includes: a first resistor, a third resistor, and a first NAND gate; a first terminal of the first resistor is connected to the first input terminal and a first input terminal of the first NAND gate, and a second terminal of the first resistor is grounded; a second input terminal of the first NAND gate is connected to the second input terminal, and an output level signal of an output terminal of the first NAND gate is same as an output level signal of the first interlock circuit; a first terminal of the third resistor is connected to a first control power supply, and a second terminal of the third resistor is connected to the output terminal of the first NAND gate; where the first terminal of the first resistor and the second terminal of the first resistor are different terminals, the first terminal of the third resistor and the second terminal of the third resistor are different terminals, and the first input terminal of the first NAND gate and the second input terminal of the first NAND gate are different input terminals.

As a further improvement of an embodiment of the present application, the first drive processing circuit specifically includes: a fourth resistor, a fifth resistor, and a first optocoupler relay; the first optocoupler relay is provided with a first input terminal, a second input terminal, and an output terminal, where the first input terminal is connected to a second terminal of the fourth resistor, the second input terminal is configured to receive a level signal output by the first interlock circuit, and a first terminal of the fourth resistor is connected to the first control power supply; the first optocoupler relay is provided with a first pin and a second pin, where the first pin of the first optocoupler relay is connected to a second terminal of the fifth resistor, the second pin of the first optocoupler relay is grounded, and a first terminal of the fifth resistor is connected to a second control power supply; and the first optocoupler relay is configured to connect the output terminal of the first optocoupler relay to the first pin of the first optocoupler relay when a voltage of the first input terminal of the first optocoupler relay is greater than a voltage of the second input terminal of the first optocoupler relay, and configured to connect the output terminal of the first optocoupler relay to the second pin of the first optocoupler relay when a voltage of the first input terminal of the first optocoupler relay is less than or equal to a voltage of the second input terminal of the first optocoupler relay; where the first terminal of the fourth resistor and the second terminal of the fourth resistor are different terminals, and the first terminal of the fifth resistor and the second terminal of the fifth resistor are different terminals.

As a further improvement of an embodiment of the present application, the first drive status feedback circuit specifically includes: a seventh resistor, an eighth resistor, a ninth resistor, a tenth resistor, a first NPN transistor, and a second optocoupler relay; a first terminal of the ninth resistor is configured to receive a level signal output by the first drive processing circuit, and a second terminal of the ninth resistor is connected to a base of the first NPN transistor; a first terminal of the eighth resistor is connected to a base of the first NPN transistor, a second terminal of the eighth resistor is connected to an emitter of the first NPN transistor, and the emitter of the first NPN transistor is grounded; a first terminal of the tenth resistor is connected to a second control power supply; the second optocoupler relay is provided with a first input terminal, a second input terminal, and an output terminal, where the first input terminal is connected to a second terminal of the tenth resistor, the second input terminal is connected to a collector of the first NPN transistor, the output terminal is connected to a second terminal of the seventh resistor, and a first terminal of the seventh resistor is connected to the first control power supply; a first optocoupler relay is provided with a grounding pin, which is grounded; and the second optocoupler relay is configured to connect the output terminal of the second optocoupler relay to the grounding pin of the first optocoupler relay when a voltage of the first input terminal of the second optocoupler relay is greater than a voltage of the second input terminal of the second optocoupler relay, and the second optocoupler relay is configured to disconnect the output terminal of the second optocoupler relay from the grounding pin of the first optocoupler relay when a voltage of the first input terminal of the second optocoupler relay is less than or equal to a voltage of the second input terminal of the second optocoupler relay.

As a further improvement of an embodiment of the present application, the second interlock circuit specifically includes: an eleventh resistor, a thirteenth resistor, and a second NAND gate; a first terminal of the eleventh resistor is connected to the first input terminal and a first input terminal of the second NAND gate, and a second terminal of the eleventh resistor is connected to the first control power supply; a second input terminal of the second NAND gate is connected to the second input terminal, and an output level signal of an output terminal of the second NAND gate is same as an output level signal of the second interlock circuit; a second terminal of the thirteenth resistor is connected to the first control power supply, and a first terminal of the thirteenth resistor is connected to the output terminal of the second NAND gate; and a Vcc terminal of the second NAND gate is connected to the first control power supply, and a ground terminal of the second NAND gate is grounded; where the first terminal of the eleventh resistor and the second terminal of the eleventh resistor are different terminals, the first terminal of the thirteenth resistor and the second terminal of the thirteenth resistor are different terminals, and the first input terminal of the second NAND gate and the second input terminal of the second NAND gate are different input terminals.

As a further improvement of an embodiment of the present application, the second drive processing circuit specifically includes: a fourteenth resistor, a fifteenth resistor, and a third optocoupler relay; the third optocoupler relay is provided with a first input terminal, a second input terminal, and an output terminal, where the first input terminal is connected to a second terminal of the fourteenth resistor, the second input terminal is configured to receive a level signal output by the second interlock circuit, and a first terminal of the fourteenth resistor is connected to the first control power supply; the third optocoupler relay is provided with a first pin and a second pin, where the first pin of the third optocoupler relay is connected to a second terminal of the fifteenth resistor, a first terminal of the fifteenth resistor is connected to a control power supply Vcc3, and the second pin of the third optocoupler relay is grounded; and the third optocoupler relay is configured to connect the output terminal of the third optocoupler relay to the first pin of the third optocoupler relay when a voltage of the first input terminal of the third optocoupler relay is greater than a voltage of the second input terminal of the third optocoupler relay, and configured to connect the output terminal of the third optocoupler relay to the second pin of the third optocoupler relay when a voltage of the first input terminal of the third optocoupler relay is less than or equal to a voltage of the second input terminal of the third optocoupler relay; where the first terminal of the fourteenth resistor and the second terminal of the fourteenth resistor are different terminals, and the first terminal of the fifteenth resistor and the second terminal of the fifteenth resistor are different terminals.

As a further improvement of an embodiment of the present application, the second drive status feedback circuit specifically includes: a seventeenth resistor, an eighteenth resistor, a nineteenth resistor, a twentieth resistor, a second NPN transistor, and a fourth optocoupler relay; a first terminal of the nineteenth resistor is configured to receive a level signal output by the second drive processing circuit, and a second terminal of the nineteenth resistor is connected to a base of the second NPN transistor; a first terminal of the eighteenth resistor is connected to a base of the second NPN transistor, a second terminal of the eighteenth resistor is connected to an emitter of the second NPN transistor, and the emitter of the second NPN transistor is grounded; a first terminal of the twentieth resistor is connected to a control power supply Vcc3; the fourth optocoupler relay is provided with a first input terminal, a second input terminal, and an output terminal; where the first input terminal is connected to a second terminal of the twentieth resistor, the second input terminal is connected to a collector of the second NPN transistor, and the output terminal is connected to a second terminal of the seventeenth resistor, and a first terminal of the seventeenth resistor is connected to the first control power supply; a third optocoupler relay is provided with a grounding pin, which is grounded; and the fourth optocoupler relay is configured to connect the output terminal of the fourth optocoupler relay to the grounding pin of the third optocoupler relay when a voltage of the first input terminal of the fourth optocoupler relay is greater than a voltage of the second input terminal of the fourth optocoupler relay, and the fourth optocoupler relay is configured to disconnect the output terminal of the fourth optocoupler relay from the grounding pin of the third optocoupler relay when a voltage of the first input terminal of the fourth optocoupler relay is less than or equal to a voltage of the second input terminal of the fourth optocoupler relay.

An embodiment of the present application provides an energy storage system, comprising: M interconnected energy storage devices; an energy storage device comprises: an energy storage battery, an aforementioned interlock device, a first MOSFET, a second MOSFET, a positive electrode, and a negative electrode; in adjacent energy storage devices, a positive electrode of an energy storage device is connected to a negative electrode of another energy storage device to form a series structure of M energy storage devices; in an energy storage device, a gate of a first MOSFET is connected to an output terminal of a first drive status feedback circuit, a gate of the second MOSFET is connected to an output terminal of a second drive status feedback circuit; and a positive terminal of an energy storage battery is connected to a source of the first MOSFET, the positive electrode and a source of the second MOSFET are connected to a drain of the first MOSFET, and a drain of the second MOSFET is connected to a negative terminal of an energy storage battery.

An embodiment of the present application provides a control method for an aforementioned energy storage system, comprising steps as follows: inputting a high level signal to a first input terminal of an interlock device in a first energy storage device and inputting a low level signal to a second input terminal of an interlock device in a first energy storage device when receiving an instruction to connect the first energy storage device to the energy storage system; where the first energy storage device is any one of M energy storage devices; inputting a low level signal to a first input terminal of an interlock device in a first energy storage device and inputting a high level signal to a second input terminal of an interlock device in a first energy storage device when receiving an instruction to bypass a second energy storage device from the energy storage system, where the second energy storage device is any one of M energy storage devices.

An embodiment of the present application provides a control device for an aforementioned energy storage system, comprising modules as follows: a first control module, configured to input a high level signal to a first input terminal of an interlock device in a first energy storage device and input a low level signal to a second input terminal of an interlock device in a first energy storage device when receiving an instruction to connect the first energy storage device to the energy storage system; where the first energy storage device is any one of M energy storage devices; and a second control module, configured to input a low level signal to a first input terminal of an interlock device in a first energy storage device and input a high level signal to a second input terminal of an interlock device in a first energy storage device when receiving an instruction to bypass the second energy storage device from the energy storage system; where the second energy storage device is any one of M energy storage devices.

The interlock device, energy storage system, control method, and device thereof provided by embodiments of the present application have the following advantages: Embodiments of the present application provide an interlock device, an energy storage system, a control method, and a device thereof. This interlock device includes: a first interlock circuit, a first drive processing circuit, a first drive status feedback circuit, a second interlock circuit, a second drive processing circuit, and a second drive status feedback circuit. The first interlock circuit, the first drive processing circuit, and the first drive status feedback circuit are connected. The second interlock circuit, the second drive processing circuit, and the second drive status feedback circuit are also connected. The first interlock circuit receives an output signal of the second drive status feedback circuit, and the second interlock circuit receives an output signal of the first drive status feedback circuit, thus forming an interlock circuit.

DETAILED DESCRIPTION

Figure 1:
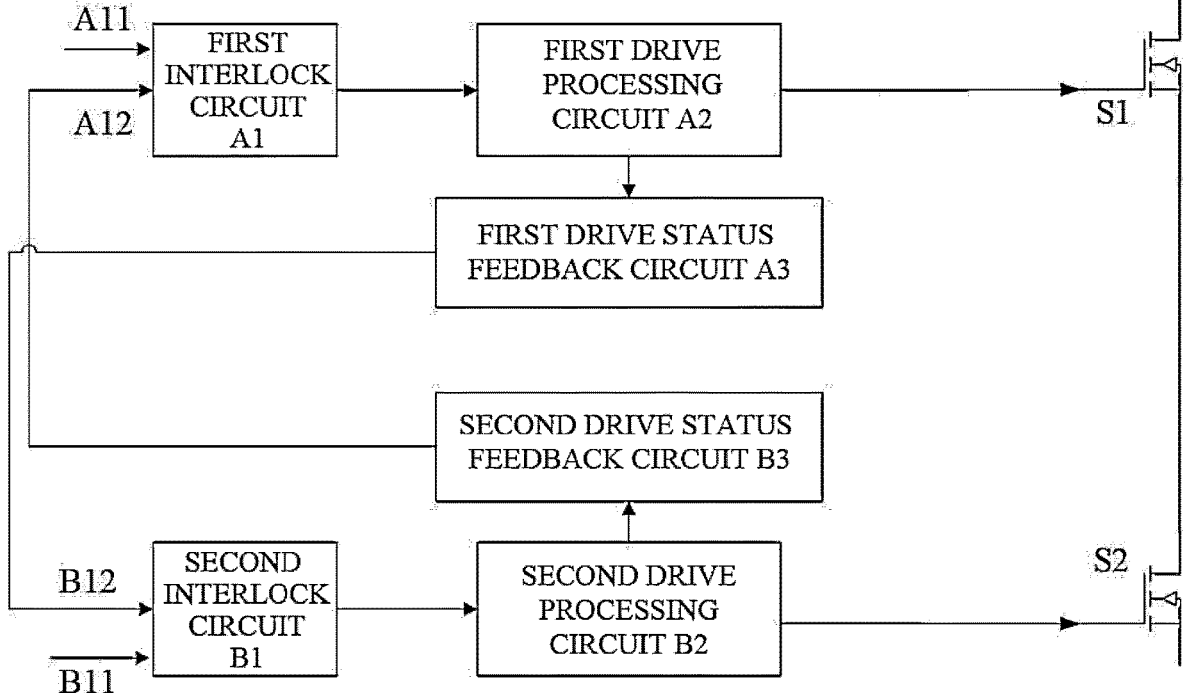
FIG. 1 shows a structural diagram of an interlock device in an embodiment of the present application.

The following detailed description of various embodiments is provided in conjunction with accompanying drawings. Embodiments do not limit the present application. Those skilled in the art can make structural, methodological, or functional changes based on the embodiments, which are included within the protective scope of the present application.

Embodiments and drawings disclosed herein sufficiently illustrate specific technical solutions of the present application to enable those skilled in the art to practice them. Parts and features of some embodiments may be included in or replace parts and features of other embodiments. The scope of embodiments includes entire scope of claims and all available equivalents of claims. Terms such as "first," "second," etc., are used only to distinguish one element from another, without requiring or implying any actual relationship or order between the elements. Practically, a first element could also be referred to as a second element, and vice versa. Moreover, terms "comprise," "include," or any of their variants are intended to cover non-exclusive inclusion, so that a structure, device, or equipment that includes a series of elements not only includes those elements but also other elements not explicitly listed, or inherent elements of the structure, device, or equipment. Without more restrictions, an element defined by the phrase "comprising a . . . " does not exclude presence of additional identical elements in a structure, device, or equipment that includes the element. Each embodiment is described progressively, with each focusing on differences from other embodiments. Similar or identical parts between the embodiments refer to each other.

The terms "longitudinal," "transverse," "upper," "lower," "front," "back," "left," "right," "vertical," "horizontal," "top," "bottom," "inner," "outer," and similar terms indicate positions or locations based on attached drawings. They are intended only for clarity and convenience and do not imply that indicated devices or elements must have a specific orientation, be constructed in a specific orientation, or operate in a specific orientation. Therefore, they should not be interpreted as limiting the present application. In the description herein, unless otherwise specified, terms such as "installation," "connection," and "attachment" should be broadly understood, including mechanical or electrical connections, direct or indirect connections through intermediaries, internal connections between elements, etc. Those skilled in the art can understand specific meanings of the terms based on specific circumstances.

Embodiment 1 of the present application provides an interlock device, as shown in FIGS. 1, 2A, 2B, 2C, 3A, 3B, and 3C, comprising:

A first interlock circuit A1, a first drive processing circuit A2, a first drive status feedback circuit A3, a second interlock circuit B1, a second drive processing circuit B2, and a second drive status feedback circuit B3. The first interlock circuit A1 is provided with a first input terminal A11 and a second input terminal A12. The first interlock circuit A1 is configured to output a low level signal when the first input terminal A11 and the second input terminal A12 input high level signals. The first interlock circuit A1 is configured to output a high level signal otherwise. The first drive processing circuit A2 is configured to receive a level signal output by the first interlock circuit A1. The first drive processing circuit A2 is configured to output a high level signal when receiving a low level signal. The first drive processing circuit A2 is configured to output a low level signal when receiving a high level signal. The first drive status feedback circuit A3 is configured to receive a level signal output by the first drive processing circuit A2. The first drive status feedback circuit A3 is configured to output a high level signal through an output terminal of the first drive status feedback circuit A3 when receiving a low level signal. The first drive status feedback circuit A3 is configured to output a low level signal through an output terminal of the first drive status feedback circuit A3 when receiving a high level signal. The second interlock circuit B1 is provided with a first input terminal B11 and a second input terminal B12. The second interlock circuit B1 is configured to output a low level signal when the first input terminal B11 and the second input terminal B12 input high level signals. The second interlock circuit B1 is configured to output a high level signal otherwise. The second drive processing circuit B2 is configured to receive a level signal output by the second interlock circuit B1. The second drive processing circuit B2 is configured to output a high level signal when receiving a low level signal. The second drive processing circuit B2 is configured to output a low level signal when receiving a high level signal. The second drive status feedback circuit B3 is configured to receive a level signal output by the second drive processing circuit B2. The second drive status feedback circuit B3 is configured to output a high level signal through an output terminal of the second drive status feedback circuit B3 when receiving a low level signal. The second drive status feedback circuit B3 is configured to output a low level signal through an output terminal of the second drive status feedback circuit B3 when receiving a high level signal. The second input terminal A12 is configured to receive a level signal output by the second drive status feedback circuit B3, and the second input terminal B12 is configured to receive a level signal output by the first drive status feedback circuit A3.

As shown in FIG. 1, in practical use, a level signal output by the first drive processing circuit A2 is used to drive the conduction or turn-off of a first MOSFET S1. The first MOSFET S1 is on when a high level signal is output by the first drive processing circuit A2. The first MOSFET S1 is off otherwise. A level signal output by the second drive processing circuit B2 is used to drive the conduction or turn-off of a second MOSFET S2. The second MOSFET S2 is on when a high level signal is output by the second drive processing circuit B2. The second MOSFET S2 is off otherwise.

It is understood that, the first interlock circuit A1 outputs a high level when the first input terminal A11 and the second input terminal A12 of the first interlock circuit A1 are not both high level signals. Hence, the first drive processing circuit A2 outputs a low level signal, causing the first MOSFET S1 to be off. Hence, the first drive status feedback circuit A3 outputs a high level to the second input terminal B12.

The first interlock circuit A1 outputs a low level when the first input terminal A11 and the second input terminal A12 of the first interlock circuit A1 are both high level signals. Hence, the first drive processing circuit A2 outputs a high level signal, causing the first MOSFET S1 to be on. Hence, the first drive status feedback circuit A3 outputs a low level to the second input terminal B12, causing the second MOSFET S2 to be off.

The second interlock circuit B1 outputs a high level when the first input terminal B11 and the second input terminal B12 of the second interlock circuit B1 are not both high level signals. Hence, the second drive processing circuit B2 outputs a low level signal, causing the second MOSFET S2 to be off. Hence, the second drive status feedback circuit B3 outputs a high level to the second input terminal A12.

The second interlock circuit B1 outputs a low level when the first input terminal B11 and the second input terminal B12 of the second interlock circuit B1 are both high level signals. Hence, the second drive processing circuit B2 outputs a high level signal, causing the second MOSFET S2 to be on. Hence, the second drive status feedback circuit B3 outputs a low level to the second input terminal A12, causing the second MOSFET S2 to be off.

Thus, the first MOSFET S1 and the second MOSFET S2 cannot be on simultaneously, preventing the energy storage battery from short-circuiting.

Figure 2A:
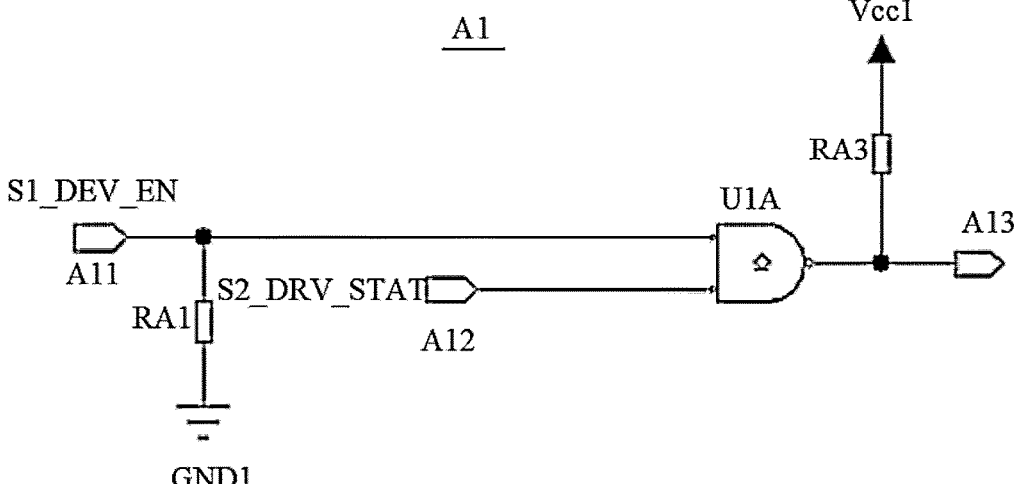
FIG. 2A shows a structural diagram of a first interlock circuit in an embodiment of the present application.

In an embodiment, as shown in FIG. 2A, the first interlock circuit A1 specifically includes:

a first resistor RA1, a third resistor RA3, and a first NAND gate U1A. A first terminal of the first resistor RA1 is connected (e.g., electrically connected) to the first input terminal A11 and a first input terminal of the first NAND gate U1A, and a second terminal of the first resistor RA1 is grounded. A second input terminal of the first NAND gate U1A is connected (e.g., electrically connected) to the second input terminal A12, and an output level signal of an output terminal of the first NAND gate U1A is same as an output level signal of the first interlock circuit A1. A first terminal of the third resistor RA3 is connected (e.g., electrically connected) to a first control power supply Vcc1, and a second terminal of the third resistor RA3 is connected (e.g., electrically connected) to the output terminal of the first NAND gate U1A. The first terminal of the first resistor RA1 and the second terminal of the first resistor RA1 are different terminals. The first terminal of the third resistor RA3 and the second terminal of the third resistor RA3 are different terminals. The first input terminal of the first NAND gate U1A and the second input terminal of the first NAND gate U1A are different input terminals.

For the first NAND gate U1A, a logic truth table is shown below:

| First input terminal A11 | Second input terminal A12 | Input terminal A13 |
|---|---|---|
| low level signal | low level signal | high level signal |
| low level signal | high level signal | high level signal |
| high level signal | low level signal | high level signal |
| high level signal | high level signal | low level signal |

The first interlock circuit A1 outputs a low level signal when both the first input terminal A11 and the second input terminal A12 input high level signals. The first interlock circuit A1 outputs a high level signal otherwise.

For ease of description, the level signal input to the first input terminal A11 can be represented as S1_DRV_EN, and the level signal input to the second input terminal A12 can be represented as S2_DRV_STAT. The first interlock circuit A1 is provided with an output terminal A13, and the output terminal of the first NAND gate U1A is connected (e.g., electrically connected) to the output terminal A13. Furthermore, the output terminal A13 is connected (e.g., electrically connected) to the first drive processing circuit A2, and a level signal output by the output terminal A13 is delivered to the first drive processing circuit A2.

A value of the low level signal output by the first interlock circuit A1 is less than a value of the high level signal output by the first interlock circuit A1. The value of the high level signal output by the first interlock circuit A1 is less than a value of the level output by the first control power supply Vcc1.

Figure 2B:
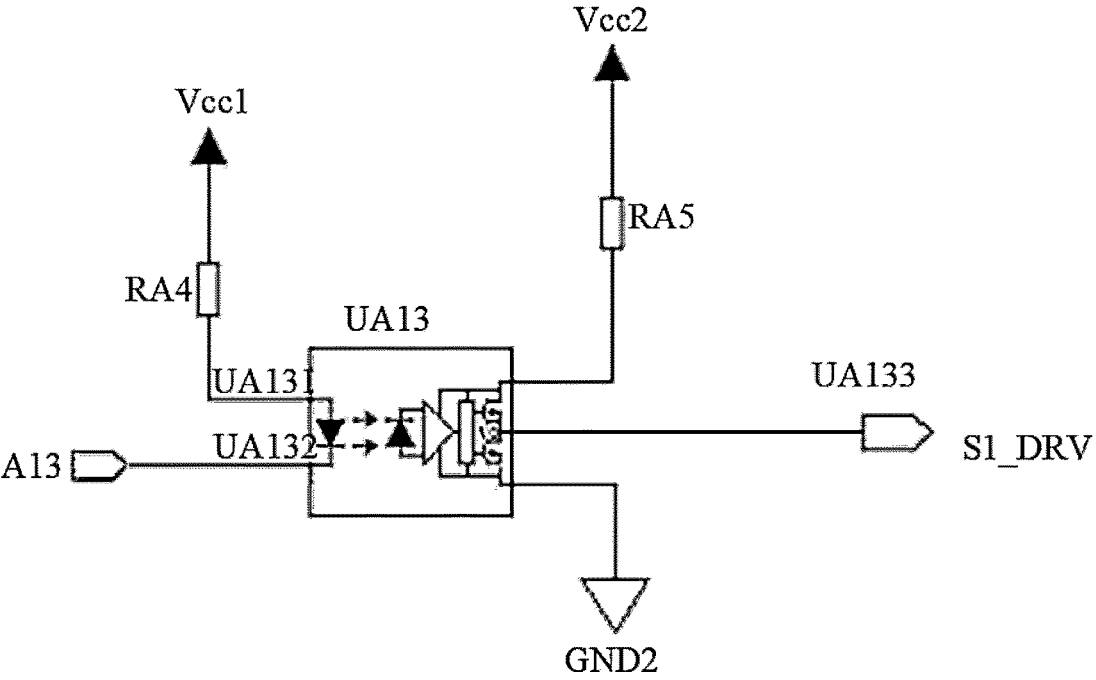
FIG. 2B shows a structural diagram of a first drive processing circuit in an embodiment of the present application.

In an embodiment, as shown in FIG. 2B, the first drive processing circuit A2 specifically includes:

a fourth resistor RA4, a fifth resistor RA5, and a first optocoupler relay UA13. The first optocoupler relay UA13 is provided with a first input terminal UA131, a second input terminal UA132, and an output terminal UA133. The first input terminal UA131 is connected (e.g., electrically connected) to a second terminal of the fourth resistor RA4. The second input terminal UA132 is configured to receive a level signal output by the first interlock circuit A1. A first terminal of the fourth resistor RA4 is connected (e.g., electrically connected) to the first control power supply Vcc1. The first optocoupler relay UA13 is provided with a first pin and a second pin. The first pin of the first optocoupler relay UA13 is connected (e.g., electrically connected) to a second terminal of the fifth resistor RA5, the second pin of the first optocoupler relay UA13 is grounded (represented as connected to GND2), and a first terminal of the fifth resistor RA5 is connected to a second control power supply. The first optocoupler relay UA13 is configured to connect (e.g., electrically connect) the output terminal UA133 of the first optocoupler relay UA13 to the first pin of the first optocoupler relay UA13 when a voltage of the first input terminal UA131 of the first optocoupler relay UA13 is greater than a voltage of the second input terminal UA132 of the first optocoupler relay UA13. The first optocoupler relay UA13 is configured to connect (e.g., electrically connect) the output terminal UA133 of the first optocoupler relay UA13 to the second pin of the first optocoupler relay UA13 when a voltage of the first input terminal UA131 of the first optocoupler relay UA13 is less than or equal to a voltage of the second input terminal UA132 of the first optocoupler relay UA13. The first terminal of the fourth resistor RA4 and the second terminal of the fourth resistor RA4 are different terminals. The first terminal of the fifth resistor RA5 and the second terminal of the fifth resistor RA5 are different terminals.

A level signal output by the first interlock circuit A1 is input to an anode pin of a LED (Light Emitting Diode) in the first optocoupler relay UA13. A terminal of the fourth resistor RA4 is connected to the first control power supply Vcc1, with another terminal of the fourth resistor RA4 connected (e.g., electrically connected) to a cathode pin of the LED in the first optocoupler relay UA13. For ease of description, a level signal output by the output terminal UA133 of the first optocoupler relay UA13 is represented as S1_DEV.

The first drive processing circuit A2 includes the fifth resistor RA5, with a terminal of the fifth resistor RA5 connected to the second control power supply Vcc2 and another terminal connected (e.g., electrically connected) to a power pin of the first optocoupler relay UA13. A pin of the first optocoupler relay UA13 is grounded. In practical use, the output level S1_DEV is used to drive switching on or switching off of a bypass switch MOSFET.

A working principle of the first drive processing circuit A2 is as follows: the first optocoupler relay UA13 outputs a high level signal through an output terminal of the first optocoupler relay UA13 when a level signal output by the first interlock circuit A1 is a low level signal, and the cathode pin of the LED in the first optocoupler relay UA13 inputs the low level signal; the first optocoupler relay UA13 outputs a low level signal through an output terminal of the first optocoupler relay UA13 when a level signal output by the first interlock circuit A1 is a high level signal, and the cathode pin of the LED in the first optocoupler relay UA13 inputs the high level signal.

Figure 2C:
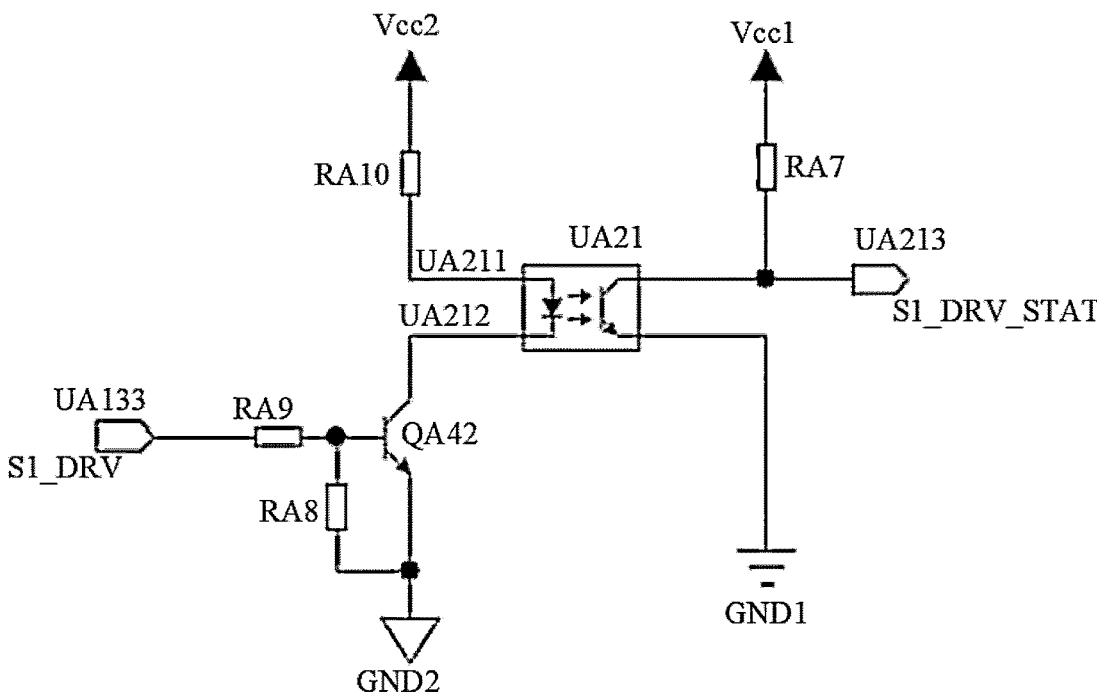
FIG. 2C shows a structural diagram of a first drive status feedback circuit in an embodiment of the present application.

In an embodiment, as shown in FIG. 2C, the first drive status feedback circuit A3 specifically includes:

a seventh resistor RA7, an eighth resistor RA8, a ninth resistor RA9, a tenth resistor RA10, a first NPN transistor QA42, and a second optocoupler relay UA21.

A first terminal of the ninth resistor RA9 is configured to receive a level signal output by the first drive processing circuit A2, and a second terminal of the ninth resistor RA9 is connected (e.g., electrically connected) to a base of the first NPN transistor QA42. A first terminal of the eighth resistor RA8 is connected (e.g., electrically connected) to a base of the first NPN transistor QA42, a second terminal of the eighth resistor RA8 is connected (e.g., electrically connected) to an emitter of the first NPN transistor QA42, and the emitter of the first NPN transistor QA42 is grounded (represented as connected to GND2). A first terminal of the tenth resistor RA10 is connected (e.g., electrically connected) to a second control power supply Vcc2. The second optocoupler relay UA21 is provided with a first input terminal UA211, a second input terminal UA212, and an output terminal UA213. The first input terminal UA211 is connected (e.g., electrically connected) to a second terminal of the tenth resistor RA10, and the second input terminal UA212 is connected (e.g., electrically connected) to a collector of the first NPN transistor QA42. The output terminal UA213 is connected (e.g., electrically connected) to a second terminal of the seventh resistor RA7, and a first terminal of the seventh resistor RA7 is connected (e.g., electrically connected) to the first control power supply Vcc1. A first optocoupler relay UA13 is provided with a grounding pin, and the grounding pin is grounded (represented as connected to GND1). The second optocoupler relay UA21 is configured to connect the output terminal UA213 of the second optocoupler relay UA21 to the grounding pin of the first optocoupler relay UA13 when a voltage of the first input terminal UA211 of the second optocoupler relay UA21 is greater than a voltage of the second input terminal UA212 of the second optocoupler relay UA21. The second optocoupler relay UA21 is configured to disconnect the output terminal UA213 of the second optocoupler relay UA21 from the grounding pin of the first optocoupler relay UA13 when a voltage of the first input terminal UA211 of the second optocoupler relay UA21 is less than or equal to a voltage of the second input terminal UA212 of the second optocoupler relay UA21.

The first terminal of the ninth resistor RA9 is used to receive a level signal S1_DRV output by the first drive processing circuit A2 (represented as a drive signal S1_DRV hereinafter). When the level signal S1_DRV is a high level signal, the first NPN transistor QA42 conducts, a level at a LED leg (e.g., a second input terminal U212) of an input side of the second optocoupler relay UA21 is pulled down to a low level, a LED inside the second optocoupler relay UA21 emits light, and a collector leg (e.g., an output terminal U213) of an output side of the second optocoupler relay UA21 conducts with an emitter leg (e.g., the aforementioned grounding pin). A drive status feedback signal connected to the collector leg (e.g., the output terminal U213) of the second optocoupler relay UA21 is a low level signal. The drive status feedback signal can be represented as S1_DRV_STAT for ease of description.

The first terminal of the ninth resistor RA9 is used to receive a level signal S1_DRV output by the first drive processing circuit A2. When the level signal S1_DRV is a low level signal, the first NPN transistor QA42 does not conduct, a LED leg (e.g., a second input terminal U212) of an input side of the second optocoupler relay UA21 is left floating, a LED inside the second optocoupler relay UA21 does not emit light, and a collector leg (e.g., an output terminal U213) of an output side of the second optocoupler relay UA21 does not conduct with an emitter leg (e.g., the aforementioned grounding pin). A drive status feedback signal connected to the collector leg (e.g., the output terminal U213) of the second optocoupler relay UA21 is a high level signal. The drive status feedback signal can be represented as S1_DRV_STAT for ease of description.

Thus, when the level signal S1_DRV output by the first drive processing circuit A2 is a low level signal, the drive status feedback signal S1_DRV_STAT is a high level signal. When the level signal S1_DRV output by the first drive processing circuit A2 is a high level signal, the drive status feedback signal S1_DRV_STAT is a low level signal.

Figure 3A:
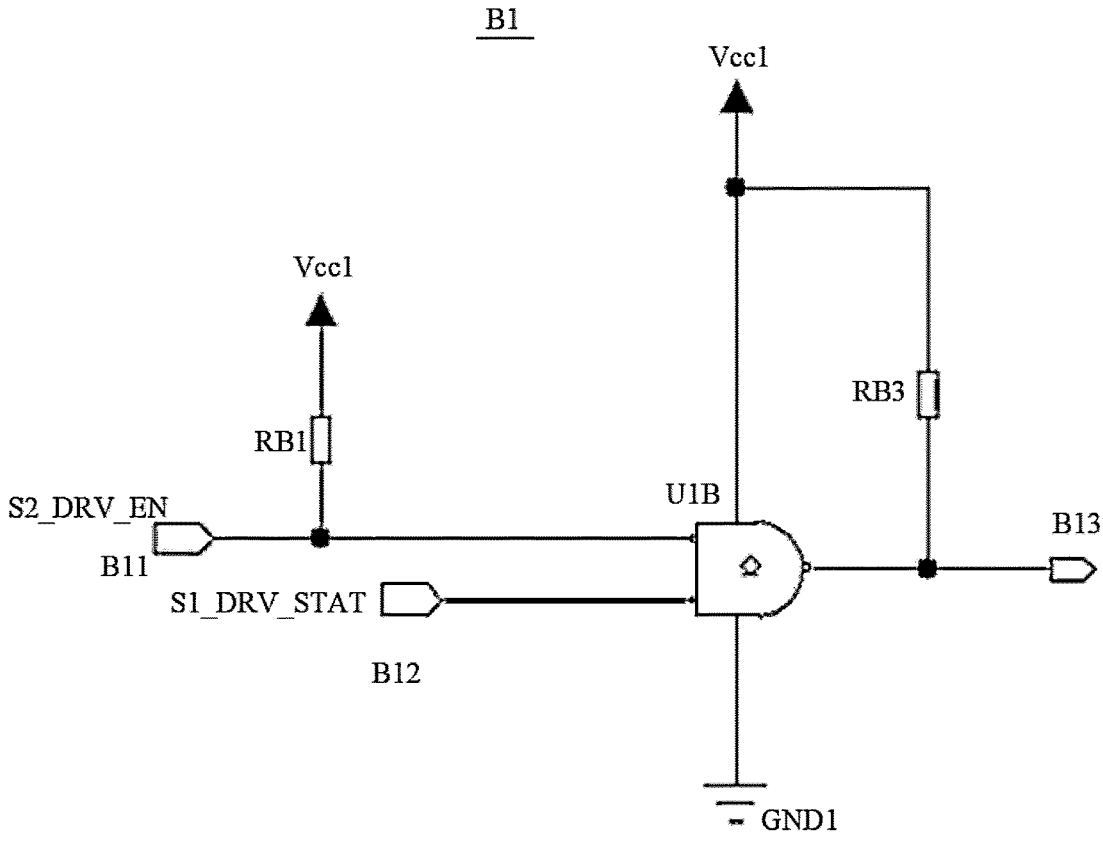
FIG. 3A shows a structural diagram of a second interlock circuit in an embodiment of the present application.

In an embodiment, as shown in FIG. 3A, the second interlock circuit B1 specifically includes:

an eleventh resistor RB1, a thirteenth resistor RB3, and a second NAND gate U1B. A first terminal of the eleventh resistor RB1 is connected (e.g., electrically connected) to the first input terminal B11 and a first input terminal of the second NAND gate U1B, and a second terminal of the eleventh resistor RB1 is connected (e.g., electrically connected) to the first control power supply Vcc1. A second input terminal of the second NAND gate U1B is connected (e.g., electrically connected) to the second input terminal B12, and an output level signal of an output terminal of the second NAND gate U1B is same as an output level signal of the second interlock circuit B1. A second terminal of the thirteenth resistor RB3 is connected (e.g., electrically connected) to the first control power supply Vcc1, and a first terminal of the thirteenth resistor RB3 is connected (e.g., electrically connected) to the output terminal of the second NAND gate U1B. A Vcc terminal of the second NAND gate U1B is connected (e.g., electrically connected) to the first control power supply Vcc1, and a ground terminal of the second NAND gate U1B is grounded (represented as connected to GND1). The first terminal of the eleventh resistor RB1 and the second terminal of the eleventh resistor RB1 are different terminals. The first terminal of the thirteenth resistor RB3 and the second terminal of the thirteenth resistor RB3 are different terminals. The first input terminal of the second NAND gate U1B and the second input terminal of second NAND gate U1B are different input terminals.

For the second NAND gate U1B, a logic truth table is shown below:

| First input terminal B11 | Second input terminal B12 | Input terminal B13 |
|---|---|---|
| low level signal | low level signal | high level signal |
| low level signal | high level signal | high level signal |
| high level signal | low level signal | high level signal |
| high level signal | high level signal | low level signal |

The second interlock circuit B1 outputs a low level signal when both the first input terminal B11 and the second input terminal B12 input high level signals. The second interlock circuit B1 outputs a high level signal otherwise.

For ease of description, the level signal input to the first input terminal B11 can be represented as S2_DRV_EN, and the level signal input to the second input terminal B12 can be represented as S2_DRV_STAT. The second interlock circuit B1 is provided with an output terminal B13, and the output terminal of the second NAND gate U1B is connected (e.g., electrically connected) to the output terminal B13. Furthermore, the output terminal B13 is connected (e.g., electrically connected) to the second drive processing circuit B2, and a level signal output by the output terminal B13 is delivered to the second drive processing circuit B2.

A value of the low level signal output by the second interlock circuit B1 is less than a value of the high level signal output by the second interlock circuit B1. The value of the high level signal output by the second interlock circuit B1 is less than a value of the level output by the first control power supply Vcc1.

Figure 3B:
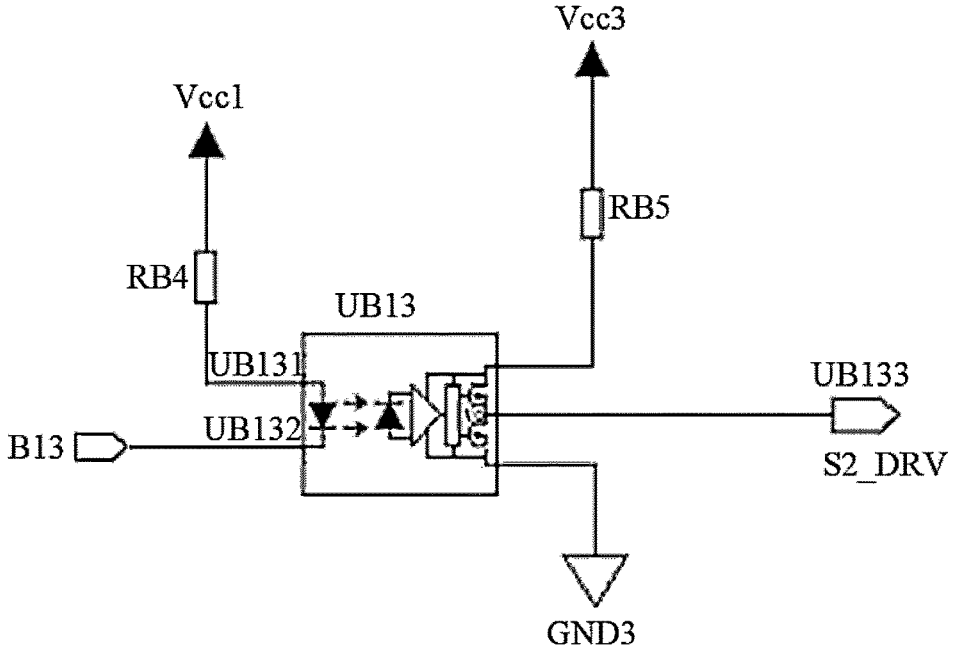
FIG. 3B shows a structural diagram of a second drive processing circuit in an embodiment of the present application.

In an embodiment, as shown in FIG. 3B, the second drive processing circuit B2 specifically includes:

a fourteenth resistor RB4, a fifteenth resistor RB5, and a third optocoupler relay UB13. The third optocoupler relay UB13 is provided with a first input terminal UB131, a second input terminal UB132, and an output terminal UB133. The first input terminal UB131 is connected (e.g., electrically connected) to a second terminal of the fourteenth resistor RB4, and the second input terminal UB132 is configured to receive a level signal output by the second interlock circuit B1. A first terminal of the fourteenth resistor RB4 is connected (e.g., electrically connected) to the first control power supply Vcc1. The third optocoupler relay UB13 is provided with a first pin and a second pin. The first pin of the third optocoupler relay UB13 is connected (e.g., electrically connected) to a second terminal of the fifteenth resistor RB5, the second pin of the third optocoupler relay UB13 is grounded (represented as connected to GND3), and a first terminal of the fifteenth resistor RB5 is connected (e.g., electrically connected) to a control power supply Vcc3. The third optocoupler relay UB13 is configured to connect the output terminal UB133 of the third optocoupler relay UB13 to the first pin of the third optocoupler relay UB13 when a voltage of the first input terminal UB131 of the third optocoupler relay UB13 is greater than a voltage of the second input terminal UB132 of the third optocoupler relay UB13. The third optocoupler relay UB13 is configured to connect the output terminal UB133 of the third optocoupler relay UB13 to the second pin of the third optocoupler relay UB13 when a voltage of the first input terminal UB131 of the third optocoupler relay UB13 is less than or equal to a voltage of the second input terminal UB132 of the third optocoupler relay UB13. The first terminal of the fourteenth resistor RB4 and the second terminal of the fourteenth resistor RB4 are different terminals. The first terminal of the fifteenth resistor RB5 and the second terminal of the fifteenth resistor RB5 are different terminals.

A level signal output by the second interlock circuit B1 is input to an anode pin of a LED (Light Emitting Diode) in the third optocoupler relay UB13. A terminal of the fourteenth resistor RB4 is connected to the first control power supply Vcc1, with another terminal of the fourteenth resistor RB4 connected (e.g., electrically connected) to a cathode pin of the LED in the third optocoupler relay UB13. For ease of description, a level signal output by the output terminal UB133 of the third optocoupler relay UB13 is represented as S1_DEV.

The second drive processing circuit B2 includes the fifteenth resistor RB5, with a terminal of the fifteenth resistor RB5 connected to the second control power supply Vcc2 and another terminal connected (e.g., electrically connected) to a power pin of the third optocoupler relay UB13. A pin of the third optocoupler relay UB13 is grounded. In practical use, the output level S1_DEV is used to drive switching on or switching off of a bypass switch MOSFET.

A working principle of the second drive processing circuit B2 is as follows: the third optocoupler relay UB13 outputs a high level signal through an output terminal of the third optocoupler relay UB13 when a level signal output by the second interlock circuit B1 is a low level signal, and the cathode pin of the LED in the third optocoupler relay UB13 inputs the low level signal; the third optocoupler relay UB13 outputs a low level signal through an output terminal of the third optocoupler relay UB13 when a level signal output by the second interlock circuit B1 is a high level signal, and the cathode pin of the LED in the third optocoupler relay UB13 inputs the high level signal.

Figure 3C:
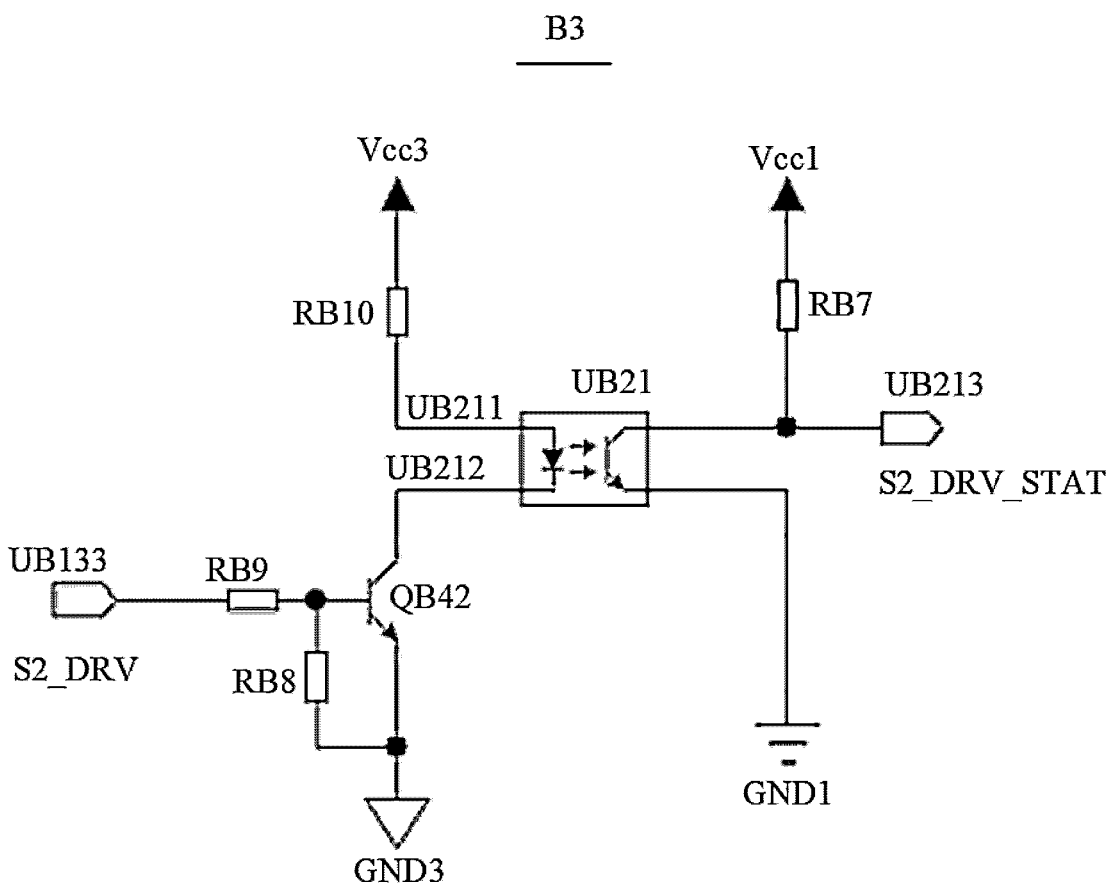
FIG. 3C shows a structural diagram of a second drive status feedback circuit in an embodiment of the present application.

In an embodiment, as shown in FIG. 3C, the second drive status feedback circuit B3 specifically includes:

a seventeenth resistor RB7, an eighteenth resistor RB8, a nineteenth resistor RB9, a twentieth resistor RB10, a second NPN transistor QB42, and a fourth optocoupler relay UB21. A first terminal of the nineteenth resistor RB9 is configured to receive a level signal output by the second drive processing circuit B2, and a second terminal of the nineteenth resistor RB9 is connected (e.g., electrically connected) to a base of the second NPN transistor QB42. A first terminal of the eighteenth resistor RB8 is connected (e.g., electrically connected) to a base of the second NPN transistor QB42, a second terminal of the eighteenth resistor RB8 is connected (e.g., electrically connected) to an emitter of the second NPN transistor QB42, and the emitter of the second NPN transistor QB42 is grounded (represented as connected to GND3). A first terminal of the twentieth resistor RB10 is connected (e.g., electrically connected) to a control power supply Vcc3. The fourth optocoupler relay UB21 is provided with a first input terminal UB211, a second input terminal UB212, and an output terminal UB213. The first input terminal UB211 is connected (e.g., electrically connected) to a second terminal of the twentieth resistor RB10, and the second input terminal UB212 is connected (e.g., electrically connected) to a collector of the second NPN transistor QB42. The output terminal UB213 is connected (e.g., electrically connected) to a second terminal of the seventeenth resistor RB7, and a first terminal of the seventeenth resistor RB7 is connected (e.g., electrically connected) to the first control power supply Vcc1. A third optocoupler relay UB13 is provided with a grounding pin, and the grounding pin is grounded (represented as connected to GND1). The fourth optocoupler relay UB21 is configured to connect the output terminal UB213 of the fourth optocoupler relay UB21 to the grounding pin of the third optocoupler relay UB13 when a voltage of the first input terminal UB211 of the fourth optocoupler relay UB21 is greater than a voltage of the second input terminal UB212 of the fourth optocoupler relay UB21. The fourth optocoupler relay UB21 is configured to disconnect the output terminal UB213 of the fourth optocoupler relay UB21 from the grounding pin of the third optocoupler relay UB13 when a voltage of the first input terminal UB211 of the fourth optocoupler relay UB21 is less than or equal to a voltage of the second input terminal UB212 of the fourth optocoupler relay UB21.

The first terminal of the nineteenth resistor RB9 is used to receive a level signal S2_DRV output by the second drive processing circuit B2 (represented as a drive signal S2_DRV hereinafter). When the level signal S2_DRV is a high level signal, the second NPN transistor QB42 conducts, a level at a LED leg (e.g., a second input terminal U212) of an input side of the fourth optocoupler relay UB21 is pulled down to a low level, a LED inside the fourth optocoupler relay UB21 emits light, and a collector leg (e.g., an output terminal U213) of an output side of the fourth optocoupler relay UB21 conducts with an emitter leg (e.g., the aforementioned grounding pin). A drive status feedback signal connected to the collector leg (e.g., the output terminal U213) of the fourth optocoupler relay UB21 is a low level signal. The drive status feedback signal can be represented as S2_DRV_STAT for ease of description.

The first terminal of the nineteenth resistor RB9 is used to receive a level signal S2_DRV output by the second drive processing circuit B2. When the level signal S2_DRV is a low level signal, the second NPN transistor QB42 does not conduct, a LED leg (e.g., a second input terminal U212) of an input side of the fourth optocoupler relay UB21 is left floating, a LED inside the fourth optocoupler relay UB21 does not emit light, and a collector leg (e.g., an output terminal U213) of an output side of the fourth optocoupler relay UB21 does not conduct with an emitter leg (e.g., the aforementioned grounding pin). A drive status feedback signal connected to the collector leg (e.g., the output terminal U213) of the fourth optocoupler relay UB21 is a high level signal. The drive status feedback signal can be represented as S2_DRV_STAT for ease of description.

Thus, when the level signal S2_DRV output by the second drive processing circuit B2 is a low level signal, the drive status feedback signal S2_DRV_STAT is a high level signal. When the level signal S2_DRV output by the second drive processing circuit B2 is a high level signal, the drive status feedback signal S2_DRV_STAT is a low level signal.

Initial Power-on State of the Circuit:

1. In the first interlock circuit A1, due to presence of the first resistor RA1, a level of a drive enable signal S1_DRV_EN is pulled down to a low level; due to presence of the seventeenth resistor RB7, a level of a drive status feedback signal S2_DRV_STAT is pulled up to a high level. After processing on the drive enable signal S1_DRV_EN and the drive status feedback signal S2_DRV_STAT by the first interlock circuit A1, a high level signal is output. The high level signal is input to the first drive processing circuit A2, processed by the first drive processing circuit A2, and a low-level drive signal S1_DRV is output by the first drive processing circuit A2, causing the first MOSFET S1 to be off. A level of a drive status feedback signal S1_DRV_STAT output by the first drive status feedback circuit A3 is pulled up to a high level.

In the second interlock circuit B1, due to presence of the eleventh resistor RB1, a level of a drive enable signal S2_DRV_EN is pulled up to a high level; due to presence of the seventh resistor RA7, a level of a drive status feedback signal S1_DRV_STAT is pulled up to a high level. After processing on the drive enable signal S2_DRV_EN and the drive status feedback signal S1_DRV_STAT by the second interlock circuit B1, a low level signal is output. The low level signal is input to the second drive processing circuit B2, processed by the second drive processing circuit B2, and a high-level drive signal S2_DRV is output by the second drive processing circuit B2, causing the second MOSFET S2 to be on. A level of a drive status feedback signal S2_DRV_STAT output by the second drive status feedback circuit B3 is a low level.

Thus, in the initial power-on state, if the drive signal S1_DRV is a low level signal, the first MOSFET S1 is off; if the drive signal S2_DRV is a high level signal, the second MOSFET S2 is on. Owing to the first MOSFET S1 and the second MOSFET S2, the energy storage battery will not short circuit.

2. If the drive enable signal S1_DRV_EN is a low level signal, and the drive enable signal S2_DRV_EN is a high level signal, the two drive enable signals are same as in the initial power-on state, the drive signal S1_DRV is a low level signal, the first MOSFET S1 is off; the drive signal S2_DRV is a high level signal, the second MOSFET S2 is on. The first MOSFET S1 and the second MOSFET S2 are not on simultaneously, the energy storage battery will not short circuit.

3. If the drive enable signal S1_DRV_EN is a high level signal, and the drive enable signal S2_DRV_EN is a low level signal. Due to the initial power-on state, a drive status feedback signal S2_DRV_STAT is a low level signal. According to a logic truth table of the first interlock circuit A1, the first interlock circuit A1 outputs a high level signal, which enters the first drive processing circuit A2, and the first drive processing circuit A2 outputs a low-level drive signal S1_DRV, causing the first MOSFET S1 to be off. When the drive status feedback signal S2_DRV_STAT is a low level signal (the drive signal S2_DRV is a high level signal), even if the first drive enable signal S1_DRV_EN is a high level signal, the first MOSFET S1 cannot conduct and is in an off state. If the drive enable signal S2_DRV_EN is a low level signal, according to a logic truth table of the second interlock circuit B1, the second interlock circuit B1 outputs a high level signal, which is processed by the second drive processing circuit B2, and the second drive processing circuit B2 outputs a low-level drive signal S2_DRV, causing the second MOSFET S2 to be off. Thus, from the initial power-on state to a state where the drive enable signal S1_DRV_EN is a high level signal and the drive enable signal S2_DRV_EN is a low level signal, the drive signal S1_DRV is a low level signal, and the first MOSFET S1 and the second MOSFET S2 are both off.

4. If the drive enable signal S1_DRV_EN and the drive enable signal S2_DRV_EN are both high level signals. Due to the initial power-on state, a drive status signal S1_DRV_STAT is a high level signal and a drive status feedback signal S2_DRV_STAT is a low level signal. According to a logic truth table of the first interlock circuit A1, the first interlock circuit A1 outputs a high level signal, which enters the first drive processing circuit A2, and the first drive processing circuit A2 outputs a low-level drive signal S1_DRV, causing the first MOSFET S1 to be off. When the drive status feedback signal S2_DRV_STAT is a low level signal (the drive signal S2_DRV is a high level signal), even if the drive enable signal S1_DRV_EN is a high level signal, the first MOSFET S1 cannot conduct and is in an off state. At the initial power-on state, the drive enable signal S2_DRV_EN is pulled up to a high level. After processed by the second drive processing circuit B2, a high-level drive signal is output, and the second MOSFET S2 is on. When the drive enable signal S2_DRV_EN is a high level signal, the second MOSFET S2 is still on. The first MOSFET S1 and the second MOSFET S2 do not conduct simultaneously.

5. If the drive enable signal S1_DRV_EN and the drive enable signal S2_DRV_EN are both low level signals. Due to the initial power-on state, a drive status signal S1_DRV_STAT is a high level signal and a drive status feedback signal S2_DRV_STAT is a low level signal. According to a logic truth table of the second interlock circuit B1, the second interlock circuit B1 outputs a high level signal, which enters the second drive processing circuit B2, and the second drive processing circuit B2 outputs a low-level drive signal S2_DRV, causing the second MOSFET S2 to be off. At the initial power-on state, the drive enable signal S1_DRV_EN is pulled down to a low level. After processed by the drive processing circuit A2, a low-level drive signal is output, and the first MOSFET S1 is off. When the drive enable signal S1_DRV_EN is a low level signal, the first MOSFET S1 is still off. When the drive enable signal S1_DRV_EN and the drive enable signal S2_DRV_EN are both low level signals, the drive signal S1_DRV and the drive signal S2_DRV are both low level signals, and the first MOSFET S1 and the second MOSFET S2 are both off.

Figure 4:
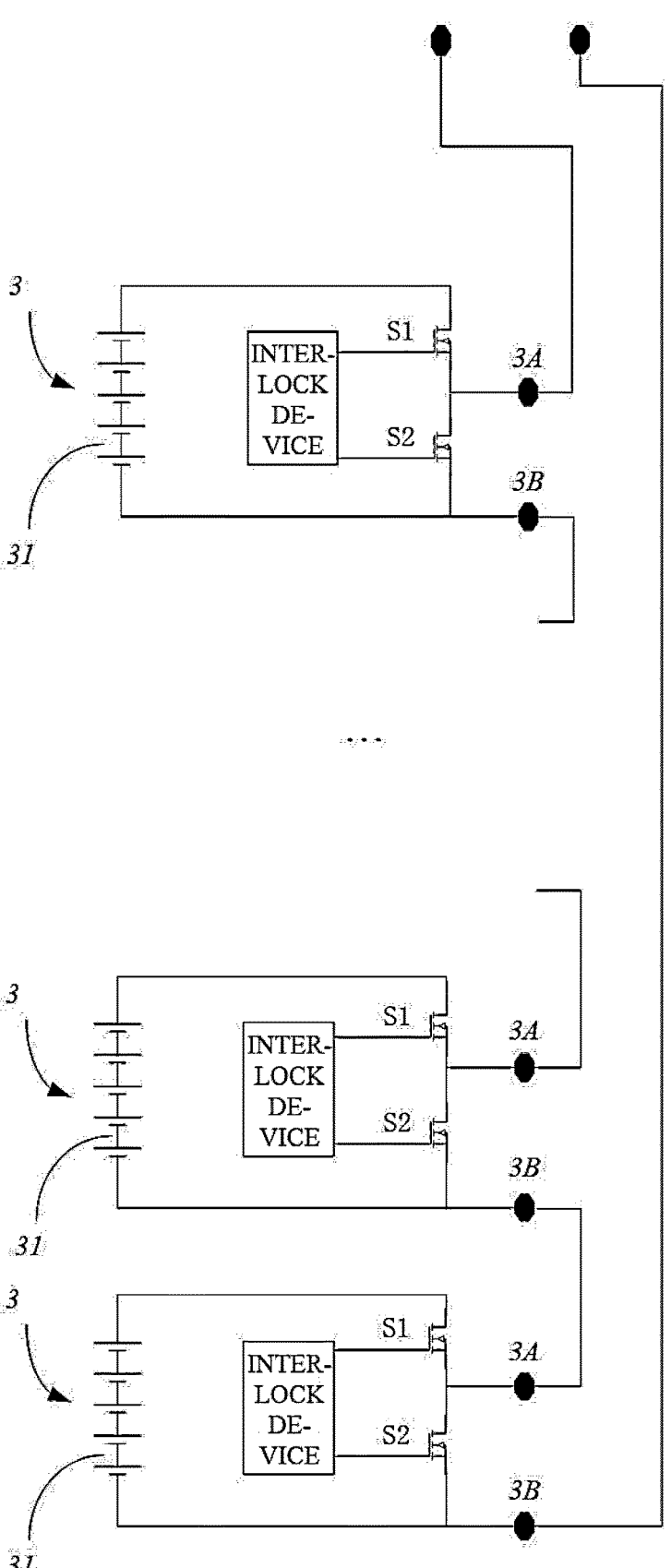
FIG. 4 shows a structural diagram of an energy storage system in an embodiment of the present application.

Embodiment 2 of the present application provides an energy storage system, as shown in FIG. 4, comprising:

M interconnected energy storage devices 3. An energy storage device (e.g., each energy storage device) 3 includes: an energy storage battery 31, an interlock device, a first MOSFET S1, a second MOSFET S2, a positive electrode 3A, and a negative electrode 3B. The interlock device is configured as the Embodiment 1.

In two adjacent energy storage devices, a positive electrode 3A of an energy storage device 3 is connected (e.g., electrically connected) to a negative electrode 3B of another energy storage device 3, forming a series structure of M energy storage devices 3.

In an energy storage device (e.g., each energy storage device) 3, a gate of a first MOSFET S1 is connected (e.g., electrically connected) to an output terminal of a first drive status feedback circuit A3, and a gate of the second MOSFET S2 is connected (e.g., electrically connected) to an output terminal of a second drive status feedback circuit B3. A positive terminal of energy storage battery 31 is connected (e.g., electrically connected) to a source of the first MOSFET S1. The positive electrode 3A and a source of the second MOSFET S2 are connected (e.g., electrically connected) to a drain of the first MOSFET S1, and a drain of the second MOSFET S2 is connected (e.g., electrically connected) to a negative terminal of an energy storage battery 31.

Embodiment 3 of the present application provides a control method. The control method is for the energy storage system in the Embodiment 2. The control method comprises steps as follows:

Step 1: inputting a high level signal to a first input terminal A11 of an interlock device in a first energy storage device and inputting a low level signal to a second input terminal B12 of an interlock device in a first energy storage device when receiving an instruction to connect the first energy storage device to the energy storage system. The first energy storage device is any one of M energy storage devices 3.

Step 2: inputting a low level signal to a first input terminal A11 of an interlock device in a first energy storage device and inputting a high level signal to a second input terminal B12 of an interlock device in a first energy storage device when receiving an instruction to bypass a second energy storage device from the energy storage system. The second energy storage device is any one of M energy storage devices 3.

Embodiment 4 of the present application provides a control device. The control device is for the energy storage system in the Embodiment 2. The control device comprises modules as follows:

A first control module, configured to input a high level signal to a first input terminal A11 of an interlock device in a first energy storage device and input a low level signal to a second input terminal B12 of an interlock device in a first energy storage device when receiving an instruction to connect the first energy storage device to the energy storage system. The first energy storage device is any one of M energy storage devices 3.

A second control module, configured to input a low level signal to a first input terminal A11 of an interlock device in a first energy storage device input a high level signal to a second input terminal B12 of an interlock device in a first energy storage device, respectively, when receiving a command to bypass the second energy storage device from the energy storage system. The second energy storage device is any one of M energy storage devices 3.

It should be understood that although this specification describes embodiments, each embodiment does not necessarily only include a single independent technical solution. The style of description is purely for clarity. Those skilled in the art should consider this specification as a whole, and the technical solutions in various embodiment can be appropriately combined to form other embodiments that can be understood by those skilled in the art.

The detailed descriptions listed above are specific illustrations of feasible embodiments of the present application. They are not intended to limit the scope of the application. Any equivalent implementation or change that does not depart from the spirit of the application is within the scope of the present application.

What is claimed is:

1. An interlock device, comprising:

a first interlock circuit (A1), a first drive processing circuit (A2), a first drive status feedback circuit (A3), a second interlock circuit (B1), a second drive processing circuit (B2), and a second drive status feedback circuit (B3); the first interlock circuit (A1) is provided with a first input terminal (A11) and a second input terminal (A12), the first interlock circuit (A1) is configured to output a first low level signal when the first input terminal (A11) of the first interlock circuit (A1) and the second input terminal (A12) of the first interlock circuit (A1) input high level signals, and the first interlock circuit (A1) is configured to output a first high level signal otherwise; the first drive processing circuit (A2) is configured to receive the first high level signal or the first low level signal output by the first interlock circuit (A1), the first drive processing circuit (A2) is configured to output a second high level signal when receiving the first low level signal, and the first drive processing circuit (A2) is configured to output a second low level signal when receiving the first high level signal; the first drive status feedback circuit (A3) is configured to receive the second high level signal or the second low level signal output by the first drive processing circuit (A2), the first drive status feedback circuit (A3) is configured to output a third high level signal through an output terminal of the first drive status feedback circuit (A3) when receiving the second low level signal, and the first drive status feedback circuit (A3) is configured to output a third low level signal through the output terminal of the first drive status feedback circuit (A3) when receiving the second high level signal;

the second interlock circuit (B1) is provided with a first input terminal (B11) and a second input terminal (B12), the second interlock circuit (B1) is configured to output a fourth low level signal when the first input terminal (B11) of the second interlock circuit (B1) and the second input terminal (B12) of the second interlock circuit (B1) input high level signals, and the second interlock circuit (B1) is configured to output a fourth high level signal otherwise; the second drive processing circuit (B2) is configured to receive the fourth high level signal or the fourth low level signal output by the second interlock circuit (B1), the second drive processing circuit (B2) is configured to output a fifth high level signal when receiving the fourth low level signal, and the second drive processing circuit (B2) is configured to output a fifth low level signal when receiving the fourth high level signal; the second drive status feedback circuit (B3) is configured to receive the fifth high level signal or the fifth low level signal output by the second drive processing circuit (B2), the second drive status feedback circuit (B3) is configured to output a sixth high level signal through an output terminal of the second drive status feedback circuit (B3) when receiving the fifth low level signal; and the second drive status feedback circuit (B3) is configured to output a sixth low level signal through the output terminal of the second drive status feedback circuit (B3) when receiving the fifth high level signal; and the second input terminal (A12) of the first interlock circuit (A1) is configured to receive the sixth high level signal or the sixth low level signal output by the second drive status feedback circuit (B3), and the second input terminal (B12) of the second interlock circuit (B1) is configured to receive the third high level signal or the third low level signal output by the first drive status feedback circuit (A3).

2. The interlock device according to claim 1, wherein the first interlock circuit (A1) specifically comprises:

a first resistor (RA1), a third resistor (RA3), and a first NAND gate (U1A); a first terminal of the first resistor (RA1) is connected to the first input terminal (A11) of the first interlock circuit (A1) and a first input terminal of the first NAND gate (U1A), and a second terminal of the first resistor (RA1) is grounded;

a second input terminal of the first NAND gate (U1A) is connected to the second input terminal (A12) of the first interlock circuit (A1), and an output level signal of an output terminal of the first NAND gate (U1A) is same as an output level signal of the first interlock circuit (A1); a first terminal of the third resistor (RA3) is connected to a first control power supply (Vcc1), and a second terminal of the third resistor (RA3) is connected to the output terminal of the first NAND gate (U1A); where the first terminal of the first resistor (RA1) and the second terminal of the first resistor (RA1) are different terminals, the first terminal of the third resistor (RA3) and the second terminal of the third resistor (RA3) are different terminals; and the first input terminal of the first NAND gate (U1A) and the second input terminal of the first NAND gate (U1A) are different input terminals.

3. The interlock device according to claim 1, wherein the first drive processing circuit (A2) specifically comprises:

a fourth resistor (RA4), a fifth resistor (RA5), and a first optocoupler relay (UA13);

the first optocoupler relay (UA13) is provided with a first input terminal (UA131), a second input terminal (UA132), and an output terminal (UA133), where the first input terminal (UA131) of the first optocoupler relay (UA13) is connected to a second terminal of the fourth resistor (RA4), the second input terminal (UA132) of the first optocoupler relay (UA13) is configured to receive the first high level signal or the first low level signal output by the first interlock circuit (A1), and a first terminal of the fourth resistor (RA4) is connected to the first control power supply (Vcc1);

the first optocoupler relay (UA13) is provided with a first pin and a second pin, where the first pin of the first optocoupler relay (UA13) is connected to a second terminal of the fifth resistor (RA5), the second pin of the first optocoupler relay (UA13) is grounded, and a first terminal of the fifth resistor (RA5) is connected to a second control power supply (Vcc2); and the first optocoupler relay (UA13) is configured to connect the output terminal (UA133) of the first optocoupler relay (UA13) to the first pin of the first optocoupler relay (UA13) when a voltage of the first input terminal (UA131) of the first optocoupler relay (UA13) is greater than a voltage of the second input terminal (UA132) of the first optocoupler relay (UA13), and configured to connect the output terminal (UA133) of the first optocoupler relay (UA13) to the second pin of the first optocoupler relay (UA13) when a voltage of the first input terminal (UA131) of the first optocoupler relay (UA13) is less than or equal to a voltage of the second input terminal (UA132) of the first optocoupler relay (UA13); where the first terminal of the fourth resistor (RA4) and the second terminal of the fourth resistor (RA4) are different terminals, and the first terminal of the fifth resistor (RA5) and the second terminal of the fifth resistor (RA5) are different terminals.

4. The interlock device according to claim 1, wherein the first drive status feedback circuit (A3) specifically comprises:

a seventh resistor (RA7), an eighth resistor (RA8), a ninth resistor (RA9), a tenth resistor RA10, a first NPN transistor (QA42), and a second optocoupler relay (UA21);

a first terminal of the ninth resistor (RA9) is configured to receive the second high level signal or the second low level signal output by the first drive processing circuit (A2), and a second terminal of the ninth resistor (RA9) is connected to a base of the first NPN transistor (QA42); a first terminal of the eighth resistor (RA8) is connected to a base of the first NPN transistor (QA42), a second terminal of the eighth resistor (RA8) is connected to an emitter of the first NPN transistor (QA42), and the emitter of the first NPN transistor (QA42) is grounded;

a first terminal of the tenth resistor (RA10) is connected to a second control power supply (Vcc2);

the second optocoupler relay (UA21) is provided with a first input terminal (UA211), a second input terminal (UA212), and an output terminal (UA213), where the first input terminal (UA211) of the second optocoupler relay (UA21) is connected to a second terminal of the tenth resistor RA10, the second input terminal (UA212) of the second optocoupler relay (UA21) is connected to a collector of the first NPN transistor (QA42), and the output terminal (UA213) of the second optocoupler relay (UA21) is connected to a second terminal of the seventh resistor (RA7), and a first terminal of the seventh resistor (RA7) is connected to the first control power supply (Vcc1);

a first optocoupler relay (UA13) is provided with a grounding pin, which is grounded; and the second optocoupler relay (UA21) is configured to connect the output terminal (UA213) of the second optocoupler relay (UA21) to the grounding pin of the first optocoupler relay (UA13) when a voltage of the first input terminal (UA211) of the second optocoupler relay (UA21) is greater than a voltage of the second input terminal (UA212) of the second optocoupler relay (UA21), and the second optocoupler relay (UA21) is configured to disconnect the output terminal (UA213) of the second optocoupler relay (UA21) from the grounding pin of the first optocoupler relay (UA13) when a voltage of the first input terminal (UA211) of the second optocoupler relay (UA21) is less than or equal to a voltage of the second input terminal (UA212) of the second optocoupler relay (UA21).

5. The interlock device according to claim 1, wherein the second interlock circuit (B1) specifically comprises:

an eleventh resistor (RB1), a thirteenth resistor (RB3), and a second NAND gate (U1B); a first terminal of the eleventh resistor (RB1) is connected to the first input terminal (B11) of the second interlock circuit (B1) and a first input terminal of the second NAND gate (U1B), and a second terminal of the eleventh resistor (RB1) is connected to the first control power supply (Vcc1);

a second input terminal of the second NAND gate (U1B) is connected to the second input terminal (B12) of the second interlock circuit (B1), and an output level signal of an output terminal of the second NAND gate (U1B) is same as an output level signal of the second interlock circuit (B1); a second terminal of the thirteenth resistor (RB3) is connected to the first control power supply (Vcc1), and a first terminal of the thirteenth resistor (RB3) is connected to the output terminal of the second NAND gate (U1B); and a Vcc terminal of the second NAND gate (U1B) is connected to the first control power supply (Vcc1), and a ground terminal of the second NAND gate (U1B) is grounded; where the first terminal of the eleventh resistor (RB1) and the second terminal of the eleventh resistor (RB1) are different terminals, the first terminal of the thirteenth resistor (RB3) and the second terminal of the thirteenth resistor (RB3) are different terminals; and the first input terminal of the second NAND gate (U1B) and the second input terminal of the second NAND gate (U1B) are different input terminals.

6. The interlock device according to claim 5, wherein the second drive processing circuit (B2) specifically comprises:

a fourteenth resistor (RB4), a fifteenth resistor (RB5), and a third optocoupler relay (UB13);

the third optocoupler relay (UB13) is provided with a first input terminal (UB131), a second input terminal (UB132), and an output terminal (UB133), where the first input terminal (UB131) of the third optocoupler relay (UB13) is connected to a second terminal of the fourteenth resistor (RB4), the second input terminal (UB132) of the third optocoupler relay (UB13) is configured to receive the fourth high level signal or the fourth low level signal output by the second interlock circuit (B1), and a first terminal of the fourteenth resistor (RB4) is connected to the first control power supply (Vcc1);

the third optocoupler relay (UB13) is provided with a first pin and a second pin, where the first pin of the third optocoupler relay (UB13) is connected to a second terminal of the fifteenth resistor (RB5), a first terminal of the fifteenth resistor (RB5) is connected to a control power supply Vcc3, and the second pin of the third optocoupler relay (UB13) is grounded; and the third optocoupler relay (UB13) is configured to connect the output terminal (UB133) of the third optocoupler relay (UB13) to the first pin of the third optocoupler relay (UB13) when a voltage of the first input terminal (UB131) of the third optocoupler relay (UB13) is greater than a voltage of the second input terminal (UB132) of the third optocoupler relay (UB13), and configured to connect the output terminal (UB133) of the third optocoupler relay (UB13) to the second pin of the third optocoupler relay (UB13) when a voltage of the first input terminal (UB131) of the third optocoupler relay (UB13) is less than or equal to a voltage of the second input terminal (UB132) of the third optocoupler relay (UB13); where the first terminal of the fourteenth resistor (RB4) and the second terminal of the fourteenth resistor (RB4) are different terminals, and the first terminal of the fifteenth resistor (RB5) and the second terminal of the fifteenth resistor (RB5) are different terminals.

7. The interlock device according to claim 5, wherein the second drive status feedback circuit (B3) specifically comprises:

a seventeenth resistor (RB7), an eighteenth resistor (RB8), a nineteenth resistor (RB9), a twentieth resistor (RB10), a second NPN transistor (QB42), and a fourth optocoupler relay (UB21);

a first terminal of the nineteenth resistor (RB9) is configured to receive the fifth high level signal or the fifth low level signal output by the second drive processing circuit (B2), and a second terminal of the nineteenth resistor (RB9) is connected to a base of the second NPN transistor (QB42); a first terminal of the eighteenth resistor (RB8) is connected to a base of the second NPN transistor (QB42), a second terminal of the eighteenth resistor (RB8) is connected to an emitter of the second NPN transistor (QB42), and the emitter of the second NPN transistor (QB42) is grounded;

a first terminal of the twentieth resistor (RB10) is connected to a control power supply Vcc3;

the fourth optocoupler relay (UB21) is provided with a first input terminal (UB211), a second input terminal (UB212), and an output terminal (UB213), where the first input terminal (UB211) of the fourth optocoupler relay (UB21) is connected to a second terminal of the twentieth resistor (RB10), the second input terminal (UB212) of the fourth optocoupler relay (UB21) is connected to a collector of the second NPN transistor (QB42), and the output terminal (UB213) of the fourth optocoupler relay (UB21) is connected to a second terminal of the seventeenth resistor (RB7), and a first terminal of the seventeenth resistor (RB7) is connected to the first control power supply (Vcc1);

a third optocoupler relay (UB13) is provided with a grounding pin, which is grounded; and the fourth optocoupler relay (UB21) is configured to connect the output terminal (UB213) of the fourth optocoupler relay (UB21) to the grounding pin of the third optocoupler relay (UB13) when a voltage of the first input terminal (UB211) of the fourth optocoupler relay (UB21) is greater than a voltage of the second input terminal (UB212) of the fourth optocoupler relay (UB21), and the fourth optocoupler relay (UB21) is configured to disconnect the output terminal (UB213) of the fourth optocoupler relay (UB21) from the grounding pin of the third optocoupler relay (UB13) when a voltage of the first input terminal (UB211) of the fourth optocoupler relay (UB21) is less than or equal to a voltage of the second input terminal (UB212) of the fourth optocoupler relay (UB21).

8. An energy storage system, comprising:

M interconnected energy storage devices (3), M being a number of the energy storage devices (3); each energy storage device (3) comprises: an energy storage battery (31), an interlock device according to claim 1, a first MOSFET (S1), a second MOSFET (S2), a positive electrode (3A), and a negative electrode (3B);

in adjacent energy storage devices (3), the positive electrode (3A) of one energy storage device (3) is connected to the negative electrode (3B) of another energy storage device (3), to form a series structure of M energy storage devices (3);

in each energy storage device (3), a gate of the first MOSFET (S1) is connected to an output terminal of a first drive status feedback circuit (A3), and a gate of the second MOSFET (S2) is connected to an output terminal of a second drive status feedback circuit (B3); and a positive terminal of the energy storage battery (31) is connected to a source of the first MOSFET (S1), the positive electrode (3A) and a source of the second MOSFET (S2) are connected to a drain of the first MOSFET (S1), and a drain of the second MOSFET (S2) is connected to a negative terminal of the energy storage battery (31).

9. A control method for an energy storage system according to claim 8, comprising steps as follows:

inputting a high level signal to a first input terminal (A11) of the interlock device in a first energy storage device and inputting a low level signal to a second input terminal (B12) of the interlock device in a first energy storage device when receiving an instruction to connect the first energy storage device to the energy storage system; where the first energy storage device is any one of M energy storage devices (3);

inputting a low level signal to a first input terminal (A11) of the interlock device in a first energy storage device and inputting a high level signal to a second input terminal (B12) of the interlock device in a first energy storage device when receiving an instruction to bypass a second energy storage device from the energy storage system; where the second energy storage device is any one of M energy storage devices (3).

10. A control device for an energy storage system according to claim 8, comprising modules as follows:

a first control module, configured to input a high level signal to a first input terminal (A11) of the interlock device in a first energy storage device and input a low level signal to a second input terminal (B12) of the interlock device in a first energy storage device when receiving an instruction to connect the first energy storage device to the energy storage system; where the first energy storage device is any one of M energy storage devices (3); and a second control module, configured to input a low level signal to a first input terminal (A11) of the interlock device in a first energy storage device and input a high level signal to a second input terminal (B12) of the interlock device in a first energy storage device when receiving an instruction to bypass the second energy storage device from the energy storage system; where the second energy storage device is any one of M energy storage devices (3).

* * * * *